(12) United States Patent
Schmatz et al.

(10) Patent No.: US 9,620,880 B2
(45) Date of Patent: Apr. 11, 2017

(54) DIRECT PLUG ELEMENT HAVING IMPROVED CONTACTING

(75) Inventors: Ulrich Schmatz, Besigheim (DE); Peter Rehbein, Thuengersheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/003,285

(22) PCT Filed: Feb. 17, 2012

(86) PCT No.: PCT/EP2012/052781
§ 371 (c)(1),
(2), (4) Date: Nov. 8, 2013

(87) PCT Pub. No.: WO2012/123218
PCT Pub. Date: Sep. 20, 2012

(65) Prior Publication Data
US 2014/0057466 A1     Feb. 27, 2014

(30) Foreign Application Priority Data
Mar. 14, 2011   (DE) .................. 10 2011 005 482

(51) Int. Cl.
| | | |
|---|---|---|
| *H01R 13/15* | (2006.01) | |
| *H01R 13/26* | (2006.01) | |
| *H01R 12/57* | (2011.01) | |
| *H01R 12/50* | (2011.01) | |
| *H05K 7/10* | (2006.01) | |

(Continued)

(52) U.S. Cl.
CPC ............. *H01R 13/15* (2013.01); *H01R 13/26* (2013.01); *H01R 4/183* (2013.01); *H01R 12/57* (2013.01); *H01R 12/721* (2013.01); *H01R 23/7073* (2013.01); *H01R 23/725* (2013.01); *H05K 7/1069* (2013.01)

(58) Field of Classification Search
CPC .. H01R 12/57; H01R 23/725; H01R 23/7073; H05K 7/1069
USPC ............................................. 439/83
See application file for complete search history.

(56) References Cited

U.S. PATENT DOCUMENTS

| | | | |
|---|---|---|---|
| 4,040,713 A | | 8/1977 | Konnemann |
| 4,068,915 A | * | 1/1978 | Evans .................. H01R 12/721 |
| | | | 439/637 |
| 5,443,592 A | * | 8/1995 | Ittah ..................... H01R 13/113 |
| | | | 439/839 |

FOREIGN PATENT DOCUMENTS

| | | | |
|---|---|---|---|
| DE | 10 81 098 | 5/1960 | |
| DE | WO 2006013117 A1 * | 2/2006 | ............. H01R 13/15 |
| JP | H 07-45322 | 2/1995 | |

(Continued)

OTHER PUBLICATIONS

International Search Report for PCT/EP2012/052781, dated May 14, 2012.

*Primary Examiner* — Abdullah Riyami
*Assistant Examiner* — Justin Kratt
(74) *Attorney, Agent, or Firm* — Gerard Messina

(57) ABSTRACT

A direct plug element for contacting an electrical contact includes: a two-piece flexible direct contact having a first, separate spring element, and a second, separate spring element, the first spring element and the second spring element being situated one behind the other in a contact direction, and a first spring force of the first spring element and a second spring force of the second spring element is directed in essentially the same direction, and the second spring element includes a contact region.

29 Claims, 1 Drawing Sheet

(51) Int. Cl.
    *H01R 4/18*     (2006.01)
    *H01R 12/72*     (2011.01)

(56) References Cited

FOREIGN PATENT DOCUMENTS

| | | |
|---|---|---|
| JP | 2006-100232 | 4/2006 |
| JP | 2008-098062 | 4/2008 |
| WO | WO 2006/013117 | 2/2006 |

* cited by examiner

DIRECT PLUG ELEMENT HAVING IMPROVED CONTACTING

BACKGROUND OF THE INVENTION

1. Field of the Invention

The present invention relates to a direct plug element for contacting an electrical contact which, for instance, is situated freely exposed on a circuit board, the direct plug element allowing better contacting.

2. Description of the Related Art

The use of direct plug contacts in which a direct plug element is plugged in directly on a substrate, e.g., a circuit board or a pressed screen, has been increasing lately. The circuit boards, which are used in control units of vehicles, for example, take up less and less room due to the advances in miniaturization. A direct plug connection makes it possible to further reduce the space requirement for a plug on the control unit side. However, in particular for automotive applications, a very robust contact must be possible even when using direct plug elements.

BRIEF SUMMARY OF THE INVENTION

In contrast, the direct plug element for contacting an electrical contact according to the present invention has the advantage that it provides improved contacting, especially at an increased contact force. The contacting between the direct plug element and an electrical contact which is situated freely exposed on a circuit board, for example, may be realized in a very robust manner, so that the use especially in the automotive sector does not pose any problems. In the present invention, this is achieved in that the direct plug element includes a two-piece elastic direct contact which is provided with a first, separate spring element and a second, separate spring element. The first and the second spring element are situated one behind the other in a contact direction, and the spring forces of the two spring elements are essentially directed in the same direction. The second spring element includes a contact region which assumes the contacting with the electrical contact of the mating piece.

Especially preferable, the contact region on the second spring element is a point contact. In an especially preferred manner, the point contact may be produced by stamping on the second spring element, so that the point contact has a projecting convex shape in the contact direction.

According to another preferred development of the present invention, the first and second spring element are produced from different materials, and/or the first and the second spring element have different coatings. This makes it possible for a spring element made of copper, for instance, which has a relatively low force, to be superposed by a second, separate spring element made of steel. A greater contact force of the direct contact is thereby able to be provided in a simple and cost-effective manner. According to the present invention, the first spring element preferably is made of steel. However, steel may also be used to produce the second spring element which establishes the contact. In such a case, however, the second spring element must be coated by a noble metal such as gold, silver, palladium, tin or the like due to the limited electrical conductivity of steel.

In an especially preferred manner, the two spring elements are provided in such a way that the first spring element prestresses the second spring element in the unassembled state. This makes it possible to compensate even greater tolerances at the direct plug element or at the mating plug, should this be required.

Especially preferable, the direct contact of the direct plug element is developed in such a way that the direct contact has a spring force of between 2 to 4 Newtons in a contact direction, without causing a plastic deformation of one of the spring elements. This makes it possible to achieve a contact force that is twice as high as in the related art, without damage to the direct contact.

In furthermore preferred manner, the first and/or second spring element are/is made of a material having a thickness of approximately 0.15 mm. The material preferably is a spring steel sheet material.

According to one further preferred development of the present invention, the first and the second spring elements are jointly fixated by a shared crimping element. This makes it possible to assemble the two spring elements in a reliable, simple and cost-effective manner.

It is furthermore preferred if the crimping element is integrally formed with one of the spring elements.

Furthermore, the present invention relates to an electrical system which includes a mounting board, especially a circuit board, having freely exposed contacting regions and a direct plug element according to the present invention, which directly contacts the freely exposed contact regions.

The direct plug element according to the present invention preferably is used in vehicles, especially for contacting control units.

DETAILED DESCRIPTION OF THE INVENTION

Hereinafter, a direct plug element 1 according to a preferred exemplary embodiment of the present invention is described in detail below with reference to FIGS. 1 and 2.

Figure 1:
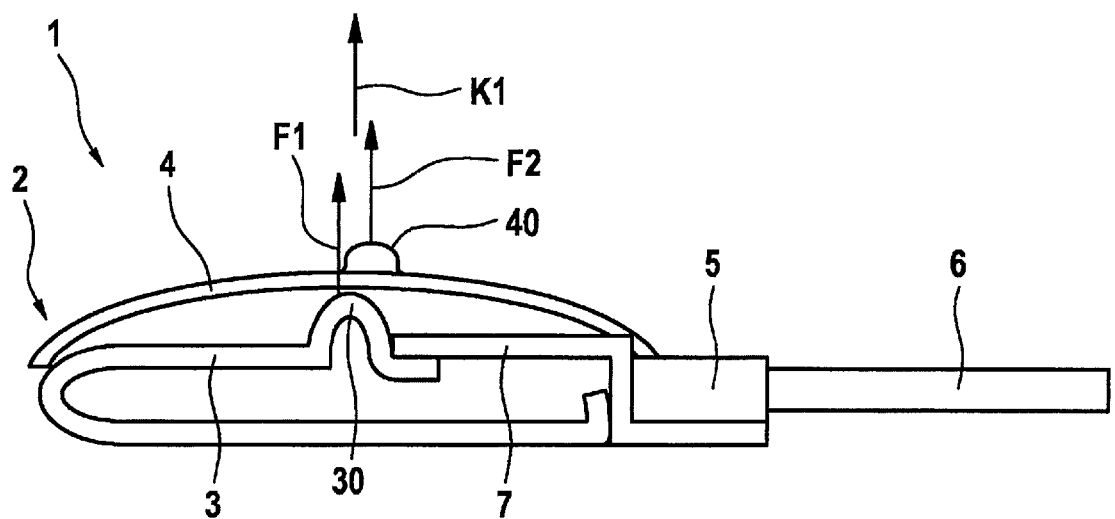
FIG. 1 shows a schematic representation of a direct plug element according to an embodiment of the present invention.

As can be gathered from FIG. 1, direct plug element 1 includes a direct contact 2 which is affixed to a cable 6 by means of a crimping element 5. Direct contact 2 includes a first spring element 3 and a second spring element 4. Both spring elements 3, 4 are provided as separate components; they are fixed in place by shared crimping element 5 and brought into electrical contact with cable 6. In addition, a stop 7 is provided, which retains first spring element 3 in a defined initial position. FIG. 1 shows the unassembled state of the direct plug element.

As can furthermore be gathered from FIG. 1, second spring element 4 includes a contact region 40 by which contacting with a freely exposed electrical contact (not shown here), such as a circuit board, is possible. Preferably, contact region 40 is integrally formed on second spring element 4 by a stamping process. In addition, first spring element 3 has a separate spring region 30, which does not exert any prestressing force on second spring element 4 in the exemplary embodiment shown in FIG. 1. However, it should be noted that the development of direct contact 2 may also be such that first spring element 3 exerts a prestressing force on second spring element 4.

In this particular exemplary embodiment, second spring element 4 is made of copper or a copper alloy, and first spring element 3 is made of steel material. In this way no coating of one of the spring elements is required for the electrical contact.

Arrow K1 in FIG. 1 indicates a contact direction of direct contact 2. First spring element 3 and second spring element 4 are situated one behind the other in contact direction K1. In this way a spring force F1 of first spring element 3 and a spring force F2 of second spring element 4 is added up in the assembled state, so that a greater spring contact force is able to be exerted on an electrical contact overall. According to the present invention, a contact force of 2 to 4 Newtons may be achieved in contact direction K1. Given the same spring travel, the contact force according to the present invention thus is roughly twice as large as a contact force in the related art.

Figure 2:
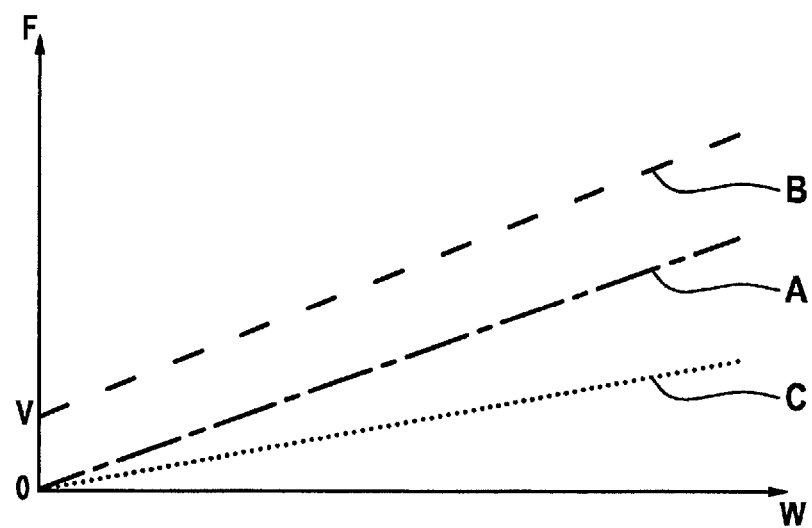
FIG. 2 shows a diagram illustrating the spring force across the spring travel.

As can be gathered from the diagram of FIG. 2, the direct plug element according to the present invention has a significantly greater spring force F across spring travel W. The curve denoted by A shows the spring characteristic of the direct contact according to the present invention without prestressing. The line denoted by B shows a spring characteristic of the direct contact with prestressing V. In other words, in characteristic B, first spring element 3 exerts prestressing V on second spring element 2 in the unassembled state. For comparison purposes, FIG. 2 also illustrates the spring characteristic of the related art, which uses only a single spring element C.

It should also be noted that second spring element 4 in particular may also be formed in one piece with crimping element 5. This reduces the number of individual parts. As an alternative, first spring element 3 and crimping element 5 may also be integrally formed. As another alternative, stop 7 may likewise be integrally formed with crimping element 5. As a further alternative, both spring elements 3, 4 may be made of steel as well, in which case second spring element 4 then is provided with a coating, e.g., of gold, silver, palladium or tin, for improved electrical conductivity.

The direct plug element according to the present invention preferably is used in control units of vehicles.

What is claimed is:

1. A direct plug element configured as a two-piece elastic direct contact for contacting an electrical contact, comprising:
    a plug, including:
        a first spring element; and
        a second spring element, the first and second spring elements configured as separate components;
    a stop element to retain the first spring element in a predetermined position; and
    a crimping element to fixate the first and second spring elements, and mechanically and electrically connect the plug to a cable,
    wherein the first spring element and the second spring element are situated one behind the other in a contact direction, a first spring force of the first spring element and a second spring force of the second spring element being directed in the same direction, and wherein the second spring element has a contact region.

2. The direct plug element as recited in claim 1, wherein the crimping element is integrally formed with one of the first and second spring elements.

3. The direct plug element as recited in claim 1, wherein the contact region is a point contact projecting a convex shape in the contact direction.

4. The direct plug element as recited in claim 1, wherein the first spring element is made of steel and the second spring element is made of copper.

5. The direct plug element as recited in claim 1, wherein the first spring element does not prestress the second spring element.

6. The direct plug element as recited in claim 1, wherein the crimping element is configured to fixate the first and second spring elements to the cable.

7. The direct plug element as recited in claim 1, wherein the first spring element includes:
    a first linear portion extending from the crimping element;
    a first curved portion extending from the first linear portion toward the second spring element;
    a second linear portion extending from the first curved portion and substantially parallel to the first linear portion; and
    a second curved portion extending from the second linear portion toward the second spring element.

8. The direct plug element as recited in claim 1, wherein the second spring element includes a curved portion extending from the crimping element alongside the first spring element, and the contact region includes a convex shape projecting from an apex of the cured portion in the contact direction.

9. The direct plug element as recited in claim 1, wherein the stop element retains the first spring element in the predetermined position so that a gap exists between the first spring element and the second spring element behind the contact region of the second spring element prior to the direct plug element contacting the electrical contact.

10. The direct plug element as recited in claim 1, wherein a portion of the first spring element that elastically deforms in response to a contact force applied to the contact includes a first material, and a portion of the second spring element that elastically deforms in response to the contact force includes a second material that is different from the first material.

11. The direct plug element as recited in claim 1, wherein the contact region of the second spring element is a point contact.

12. The direct plug element as recited in claim 11, wherein the point contact is stamped out of the second spring element.

13. The direct plug element as recited in claim 11, wherein the first spring element and the second spring element are made of different materials.

14. The direct plug element as recited in claim 13, wherein the first spring element prestresses the second spring element in an unassembled state by a prestressing force.

15. The direct plug element as recited in claim 14, wherein at least one of the first spring element and the second spring element is made of a material having a thickness of 0.15 mm.

16. contact has a spring The direct plug element as recited in claim 13, wherein the two-piece elastic direct force in the contact direction in a range of 2 to 4 Newtons.

17. The direct plug element as recited in claim 1, wherein the second spring element includes a coating at the contact region.

18. The direct plug element as recited in claim 17, wherein the coating includes at least one of: gold, silver, palladium or tin.

19. An electrical system comprising:
    a circuit board having a freely exposed contact region including an electrical contact; and a direct plug element configured as a two-piece elastic direct contact for plugging into the contact region to contact the electrical contact, the direct plug element including:
- a plug, including:
  - a first spring element; and
  - a second spring element, the first and second spring elements configured as separate components;
- a stop element to retain the first spring element in a predetermined position; and
- a crimping element to fixate the first and second spring elements, and mechanically and electrically connect the plug to a cable,
- wherein the first spring element and the second spring element are situated one behind the other in a contact direction, a first spring force of the first spring element and a second spring force of the second spring element being directed in the same direction, and wherein the second spring element has a contact region.

20. The electrical system as recited in claim 19, wherein the first spring element and the second spring element are made of different materials.

21. The electrical system as recited in claim 19, wherein the first spring element prestresses the second spring element.

22. The electrical system as recited in claim 19, wherein the crimping element is integrally formed with at least one of: the first spring element, or the second spring element.

23. The electrical system as recited in claim 19, wherein the contact region is a point contact projecting a convex shape in the contact direction.

24. The electrical system as recited in claim 19, wherein the first spring element includes:
- a first linear portion extending from the crimping element;
- a first curved portion extending from the first linear portion toward the second spring element;
- a second linear portion extending from the first curved portion and substantially parallel to the first linear portion; and
- a second curved portion extending from the second linear portion toward the second spring element.

25. The electrical system as recited in claim 19, wherein the second spring element includes a curved portion extending from the crimping element alongside the first spring element, and the contact region includes a convex shape projecting from an apex of the curved portion in the contact direction.

26. The electrical system as recited in claim 19, wherein the first spring element is made of steel and the second spring element is made of copper.

27. The electrical system as recited in claim 19, wherein the stop element retains the first spring element in the predetermined position so that a gap exists between the first spring element and the second spring element behind the contact region of the second spring element prior to the direct plug element contacting the electrical contact.

28. The electrical system as recited in claim 19, wherein a portion of the first spring element that elastically deforms in response to a contact force applied to the contact includes a first material, and a portion of the second spring element that elastically deforms in response to the contact force includes a second material that is different from the first material.

29. The electrical system as recited in claim 19, wherein the crimping element is configured to fixate the first and second spring elements to the cable.

* * * * *